United States Patent
Yim et al.

(10) Patent No.: US 9,019,746 B2
(45) Date of Patent: Apr. 28, 2015

(54) RESISTIVE MEMORY DEVICE AND METHOD FOR DRIVING THE SAME

(71) Applicant: SK Hynix Inc., Gyeonggi-do (KR)

(72) Inventors: Hyuck-Sang Yim, Gyeonggi-do (KR); Taek Sang Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 104 days.

(21) Appl. No.: 13/844,923

(22) Filed: Mar. 16, 2013

(65) Prior Publication Data

US 2014/0133214 A1  May 15, 2014

(30) Foreign Application Priority Data

Nov. 14, 2012  (KR) .......................... 10-2012-0128969

(51) Int. Cl.
*G11C 11/00* (2006.01)
*G11C 13/00* (2006.01)

(52) U.S. Cl.
CPC .................................... *G11C 13/004* (2013.01)

(58) Field of Classification Search
USPC ..................... 365/148, 209, 189.07
See application file for complete search history.

(56) References Cited

U.S. PATENT DOCUMENTS

| 5,369,614 | A  * | 11/1994 | Miyanishi | 365/207 |
| 7,535,783 | B2 * | 5/2009  | DeBrosse et al. | 365/208 |
| 7,936,588 | B2   | 5/2011  | Liu et al. | |
| 8,605,517 | B2 * | 12/2013 | Choi | 365/189.011 |
| 8,750,018 | B2 * | 6/2014  | Youn et al. | 365/148 |
| 2014/0169063 | A1 * | 6/2014 | August et al. | 365/148 |

FOREIGN PATENT DOCUMENTS

KR     1020120091583     8/2012

* cited by examiner

*Primary Examiner* — Connie Yoha
(74) *Attorney, Agent, or Firm* — IP & T Group LLP

(57) ABSTRACT

A resistive memory device includes a plurality of memory cells, each of which is configured to store a normal data, a first reference data corresponding to a first resistance state and a second reference data corresponding to a second resistance state, a data copy unit configured to temporarily store the normal data read from a selected memory cell and generate a copied cell current based on the stored normal data, a mirroring block configured to temporarily store the first and second reference data read from the selected memory cell, and to generate a first reference current and a second reference current based on the stored first and second reference data, respectively, and a sensing unit configured to sense the stored normal data based on the copied cell current and the first reference current and the second reference current.

20 Claims, 5 Drawing Sheets

RESISTIVE MEMORY DEVICE AND METHOD FOR DRIVING THE SAME

CROSS-REFERENCE TO RELATED APPLICATIONS

The present invention claims priority of Korean patent application number 10-2012-0128969, filed on Nov. 14, 2012, which is incorporated by reference in its entirety.

BACKGROUND OF THE INVENTION

Exemplary embodiments of the present invention relate to a semiconductor design technology, and more particularly, to a resistive memory device and a method for driving the same.

Non-volatile semiconductor memory devices, including flash memories and resistive memory devices, retain the stored data in unpowered conditions.

The resistive memory devices are a kind of non-volatile memories under development. A unit memory cell of a memory resistive memory includes a resistive material, as a data storage material, which has a low resistance state or a high resistance state according to an electrical signal applied thereof. There are typically phase-change random access memories (PRAMs), resistive random access memories (RRAMs) and magnetoresistive random-access memories (MRAMs) as the resistive memory devices.

In general, in order to sense the data stored in a memory cell in a resistive memory device, a current sensing scheme using a reference current has been adopted. However, since each of the memory cells has different dynamic characteristics, it may be difficult to secure a data sensing margin using the unique reference current. Moreover, the reference current may have variations.

SUMMARY OF THE INVENTION

Exemplary embodiments of the present invention are directed to a resistive memory device that may secure a data sensing margin when data stored in a memory cell is sensed.

In accordance with an aspect of the present invention, a resistive memory device includes a plurality of memory cells, each of which is configured to store a normal data, a first reference data corresponding to a first resistance state and a second reference data corresponding to a second resistance state, a data copy unit configured to temporarily store the normal data read from a selected memory cell and generate a copied cell current based on the stored normal data, a mirroring block configured to temporarily store the first and second reference data read from the selected memory cell, and to generate a first reference current and a second reference current based on the stored first and second reference data, respectively, and a sensing unit configured to sense the stored normal data based on the copied cell current and the first reference current and the second reference current.

In accordance with another aspect of the present invention, a resistive memory device includes a plurality of memory cells, each of which is configured to store a normal data, a first reference data corresponding to a first resistance state and a second reference data corresponding to a second resistance state, a mirroring unit configured to mirror a cell current flowing through a selected memory cell when the selected memory cell stores the normal data, the first reference data, or the second reference data, a first reference current generation unit configured to transfer the mirrored cell current corresponding to the normal data to a sensing node, and to temporarily store the mirrored cell current corresponding to the first reference data, and to output a first reference current to the sensing node based on the stored value, a second reference current generation unit configured to transfer the mirrored cell current corresponding to the normal data to the sensing node, and to temporarily store the mirrored cell current corresponding to the second reference data, and to output a second reference current to the sensing node based on the stored value, a data copy unit configured to be coupled to the sensing node, copy the normal data and temporarily store a sum of the cell currents, corresponding to the normal data, transferred to the sensing node from the first and second reference current generation unit, and a sensing unit configured to sense the normal data stored in the memory cell based on the voltage level of the sensing node as a read data corresponding to the normal data.

In accordance with another aspect of the present invention, a method for driving a resistive memory device includes selecting a memory cell to be read, pre-reading a normal data stored in the selected memory cell, and storing the read normal data in a temporary storage, writing a first reference data corresponding to a first resistance state on the selected memory cell, reading the first reference data and storing the read first reference data in the temporary storage, writing a second reference data corresponding to a second resistance state on the selected memory cell, reading the second reference data and storing the read first reference data in the temporary storage, and reading the normal data, which is stored in the temporary storage, based on the first reference data and the second reference data.

DESCRIPTION OF SPECIFIC EMBODIMENTS

Figure 1:
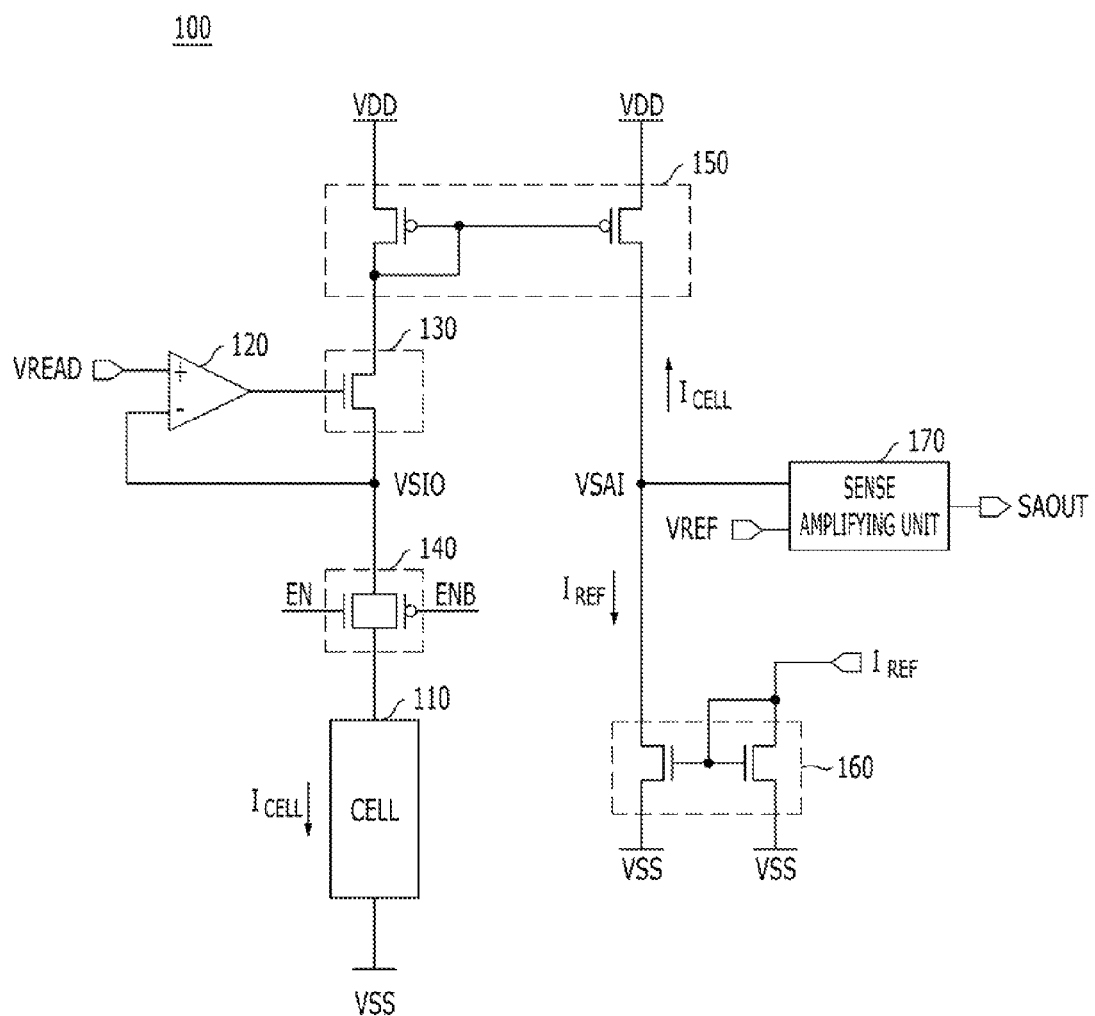
FIG. 1 is a circuit diagram for explaining a data sensing scheme in a resistive memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. In this specification, 'connected/coupled' represents that one component is directly coupled to another component indirectly coupled through another component. In addition, a singular form may include a plural form as long as it is not specifically mentioned in a sentence.

FIG. 1 is a circuit diagram for explaining a data sensing scheme in a resistive memory device.

Referring to FIG. 1, the resistive memory device 100 includes a memory cell 110, a comparison unit 120, a driving unit 130, a selection unit 140, a mirroring unit 150, a current source 160 and a sense amplifying unit 170.

The memory cell 110 may include a resistive material. The comparison unit 120 compares a voltage level of a cell node VSIO with a read voltage VREAD.

The driving unit 130 drives a current through the cell node VSIO in response to a comparison signal outputted from the comparison unit 120. The selection unit 140 selectively couples the memory cell 110 to the cell node VSIO. The mirroring unit 150 performs a mirroring operation on a cell current $I_{CELL}$ flowing through the memory cell 100 and provides a mirrored cell current $I_{CELL}$ to the voltage sensing node VSAI.

The current source 160 generates a reference current $I_{REF}$ flowing from the voltage sensing node VSAI to a ground voltage terminal VSS. The reference current $I_{REF}$ may be generated by using a current mirroring operation. The sense amplifying unit 170 senses and amplifies data stored in the memory cell 110 by comparing the voltage level of the voltage sensing node VSAI with a reference voltage VREF having a predetermined voltage level. Here, the voltage level of the voltage sensing node VSAI is determined based on a difference value of the mirrored cell current $I_{CELL}$ and the reference current $I_{REF}$.

When a selection signal EN and an inverted selection signal ENB for selecting the memory cell 100 is activated, a voltage level of the cell node VSIO is stabilized to the read reference voltage VREAD, and then the cell current $I_{CELL}$ corresponding to a resistance state of the resistive material included in the memory cell 110 flows through the cell node VSIO. Meanwhile, the mirroring unit 150 generates the mirrored cell current $I_{CELL}$ by the mirroring operation on the cell current $I_{CELL}$. The mirrored cell current $I_{CELL}$ flows from the voltage sensing node VSAI to a supply voltage terminal VDD.

Here, the voltage level of the voltage sensing node VSAI is determined based on a difference value of the mirrored cell current $I_{CELL}$ and the reference current $I_{REF}$. That is, when the amount of the mirrored cell current $I_{CELL}$ is larger than the amount of the reference current $I_{REF}$, the voltage level of the voltage sensing node VSAI increases. On the contrary, when the reference current $I_{REF}$ is larger than the cell current $I_{CELL}$, the voltage level of the voltage sensing node VSAI decreases. The sense amplifying unit 170 compares the voltage level of the voltage sensing node VSAI with the reference voltage VREF, and generates a data signal SAOUT based on the comparison result.

Meanwhile, the reference current $I_{REF}$, which is used for sensing the data stored in the memory cell 110, has the unique value irrespective of the cell characteristics. Since each of the memory cells has different dynamic characteristics, a sensing fail may occur in a certain memory cell and thus a data sensing margin may be reduced.

Figure 2:
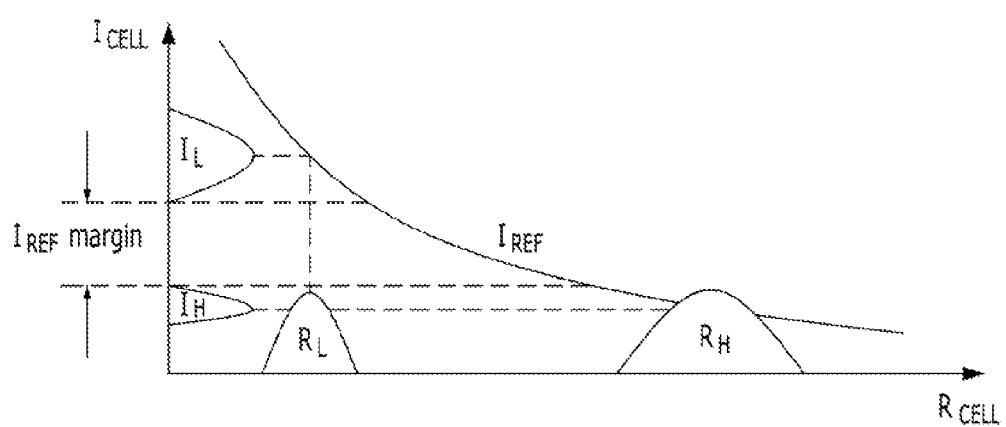
FIG. 2 is a graph illustrating a relation of a reference voltage and a characteristic of a memory cell shown in FIG. 1.

FIG. 2 is a graph illustrating a relation of a reference voltage and a characteristic of the memory 110 cell shown in FIG. 1.

As shown in FIG. 2, a range of the reference current $I_{REF}$ is determined based on a first distribution $I_H$ of the cell current $I_{CELL}$ and a second distribution $I_L$ of the cell current $I_{CELL}$. The first distribution $I_H$ of the cell current $I_{CELL}$ corresponds to a distribution $R_H$ when a resistance of a resistive material $R_{CELL}$ included in the memory cell 100 is in a high resistance state (HRS). Similarly, the second distribution $I_L$ of the cell current $I_{CELL}$ corresponds to a distribution $R_L$ when the resistance of the resistive material $R_{CELL}$ is in a low resistance state (LRS).

That is, the reference current $I_{REF}$ is defined by a range from the first distribution $I_H$ to the second distribution $I_L$ so that the cell current $I_{CELL}$ is classified. If the reference current $I_{REF}$ is defined within the first distribution $I_H$ to the second distribution $I_L$ of the cell current $I_{CELL}$ due to various changes, a sensing fail may occur in sensing the data stored in the memory cell 110.

Figure 3:
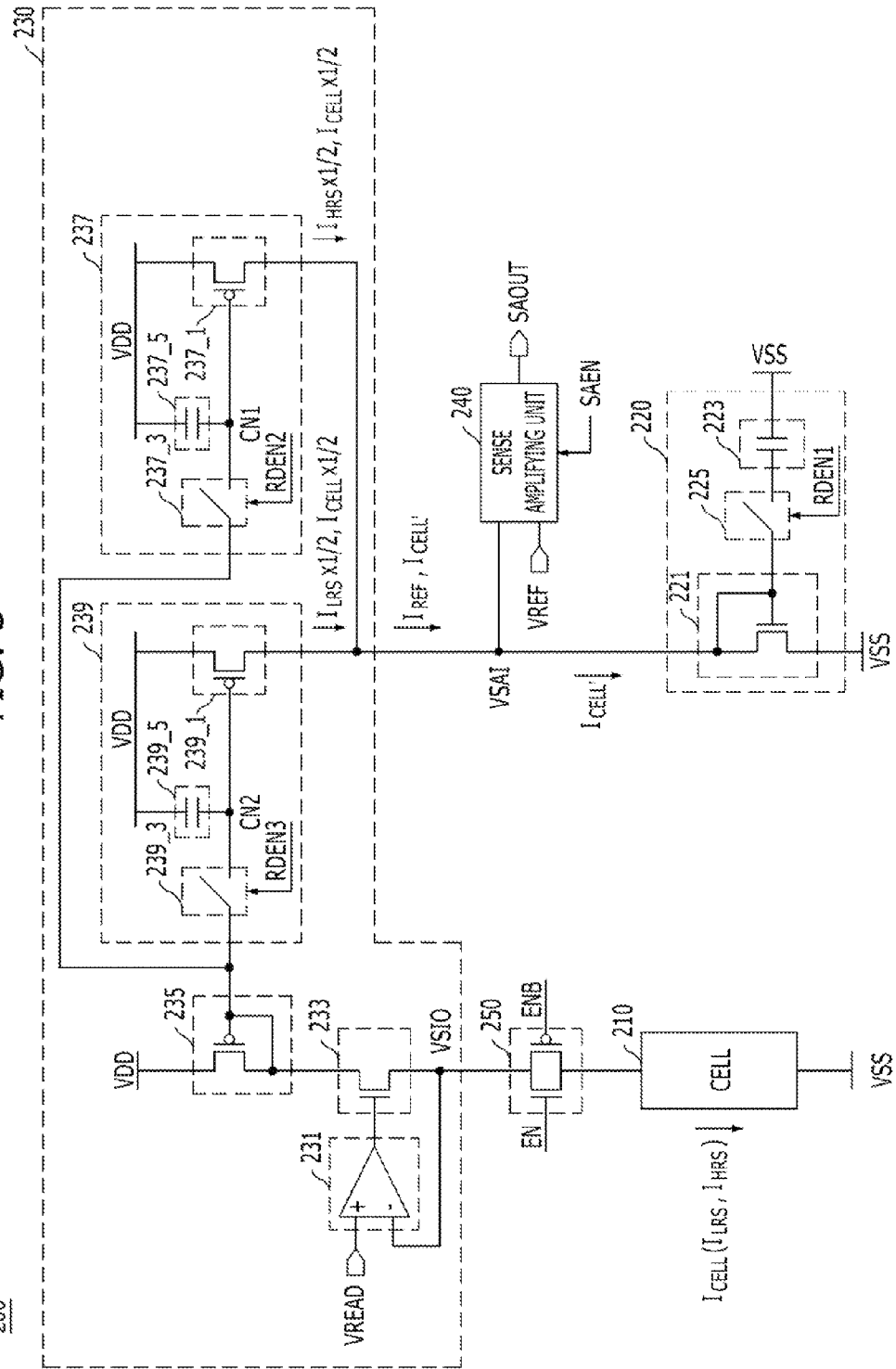
FIG. 3 is a circuit diagram illustrating a resistive memory device in accordance with an embodiment of the present invention.

FIG. 3 is a circuit diagram illustrating a resistive memory device in accordance with an embodiment of the present invention.

As shown in FIG. 3, the resistive memory device 200 includes a memory cell 210, a copy unit 220, a mirroring unit 230, a sense amplifying unit 240 and a selection unit 250.

The memory cell 210 may include a resistive material. The resistive material included in the memory cell 210 may be in a high resistance state (HRS) or a low resistance state (LRS) based on data stored therein. For example, when the resistive material is in a low resistance state (LRS), the stored data is '1', and when the resistive material is in a high resistance state (HRS), the stored data is '0'.

In the memory cell 210, a normal data, a first reference data and a second reference data may be stored (or written). When the normal data is written on the memory cell 210, a cell current flowing through the memory cell is denoted as a normal cell current $I_{CELL}$. When the first reference data corresponding to the high resistance state (HRS) is written on the memory cell 210, a cell current flowing through the memory cell is denoted as a first cell current $I_{HRS}$. When the second reference data corresponding to the low resistance state (LRS) is written on the memory cell 210, a cell current flowing through the memory cell is denoted as a second cell current $I_{LRS}$.

The data copy unit 220 is configured to copy the normal data and store a temporary data as a copied normal data. The data copy unit 220 is coupled to the memory cell 210 through a current mirroring structure including the mirroring unit 230. The data copy unit 220 may include a first mirroring unit 221, a first storage unit 223 and a first switching unit 235.

The first mirroring unit 221 is coupled between a voltage sensing node VSAI and the ground voltage terminal VSS and is configured to mirror the normal cell current $I_{CELL}$. The first storage unit 223 is coupled between the first mirroring unit 221 and the ground voltage terminal VSS, and is configured to store the normal cell current which is mirrored by the mirroring unit 221. The first storage unit 223 may include a capacitor. The first switching unit 225 is configured to selectively couple the first mirroring unit 221 to the first storage unit 223 in response to a first read enable signal RDEN1.

The mirroring unit 230 is configured to generate the reference current $I_{REF}$ based on the resistance state of the memory cell 210. The mirroring unit 230 may include a comparison unit 231, a driving unit 233, a second mirroring unit 235, a first reference current generation unit 237 and a second reference current generation unit 239.

The comparison unit 231 is configured to compare a voltage level of a cell node VSIO with a read voltage VREAD. The driving unit 233 is configured to drive a current through the cell node VSIO in response to a comparison signal outputted from the comparison unit 231. The second mirroring unit 235 is coupled between the power supply voltage terminal VDD and the driving unit 233, and is configured to mirror the first cell current $I_{HRS}$, the second cell current $I_{LRS}$ or the normal cell current $I_{CELL}$ which flows through the memory cell 210.

The first reference current generation unit 237 is configured to provide a first comparison target current $I_{CELL} \times 1/2$, which is generated by mirroring the normal cell current $I_{CELL}$, to the voltage sensing node VSAI. On the other hand, the first reference current generation unit 237 may be configured to provide a first reference current $I_{HRS} \times 1/2$, which is generated by mirroring the first cell current $I_{HRS}$, to the voltage sensing node VSAI. The first reference current generation unit 237 may include a third mirroring unit 237_1 a second switching unit 237_3 and a second storage unit 237_5.

The third mirroring unit 237_1 is coupled to the power supply voltage terminal VDD and the voltage sensing node VSAI, and is configured to provide the first comparison target current $I_{CELL} \times 1/2$ to the voltage sensing node VSAI. On the other hand, the third mirroring unit 237_1 may be configured to provide the first reference current $I_{HRS} \times 1/2$ to the voltage sensing node VSAI. The second switching unit 237_3 is configured to selectively couple the second mirroring unit 235 to the third mirroring unit 237_1 in response to a second read enable signal RDEN2. The second storage unit 237_5 is coupled between a first coupling node CN1 and the power supply voltage terminal VDD, and is configured to store the first cell current $I_{HRS}$. The first coupling node CN1 is located between the second switching unit 237_3 and the third mirroring unit 237_1.

The second current generation unit 239 may include a fourth mirroring unit 239_1, a third switching unit 239_3 and a third storage unit 239_5.

The fourth mirroring unit 239_1 is coupled between the power supply voltage terminal VDD and the voltage sensing node VSAI, and is configured to provide a second comparison target current $I_{CELL} \times 1/2$, which is generated by mirroring the normal cell current $I_{CELL}$, to the voltage sensing node VSAI. On the other hand, the fourth mirroring unit 239_1 may be configured to provide a second reference current $I_{LRS} \times 1/2$, which is generated by mirroring the second cell current $I_{LRS}$, to the voltage sensing node VSAI.

The third switching unit 239_3 is configured to selectively couple the second mirroring unit 235 to the fourth mirroring unit 239_1 in response to a third read enable signal RDEN3. The third storage unit 239_5 is coupled between a second coupling node CN2 and the power supply voltage terminal VDD, and is configured to store the second cell current $I_{LRS}$. The second coupling node CN2 is located between the third switching unit 239_3 and the fourth mirroring unit 239_1.

Here, the second to fourth mirroring units 235, 237_1 and 239_1 may include a PMOS transistor, respectively. The PMOS transistors included in the second mirroring unit 237_1 and the third mirroring unit 239_1 may have a half size of the PMOS transistor included in the first mirroring unit 235. For example, a channel of the PMOS transistors included in the second mirroring unit 237_1 and the third mirroring unit 239_1 may have a same length as a channel of the PMOS transistor included in the first mirroring unit 235 and have a half width of the channel the PMOS transistor included in of the first mirroring unit 235. Thus, each of the first comparison target current $I_{CELL} \times 1/2$ and the second comparison target current $I_{CELL} \times 1/2$ may correspond to a half of the normal cell current, respectively. Also, The first reference current $I_{HRS} \times 1/2$ and the second reference current $I_{LRS} \times 1/2$ may correspond to a half of the first cell current $I_{HRS}$ and the second cell current $I_{LRS}$, respectively. Further, the second storage unit 237_5 and the third storage unit 239_5 may include a capacitor.

The sense amplifying unit 240 is configured to sense and amplify the normal data stored in the memory cell 210 based on the reference current $I_{REF}$ and the comparison target current (i.e., copied cell current) $I_{CELL'}$ in response to a sensing enable signal SAEN.

The selection unit 250 selectively is configured to couple the memory cell 210 to the mirroring unit 230 in response to a selection signal EN and an inverted selection signal ENB. When the memory cell 210 is selected in a read operation, the selection signal EN and the inverted selection signal ENB are activated and thus a cell current path may be formed.

Figure 4:
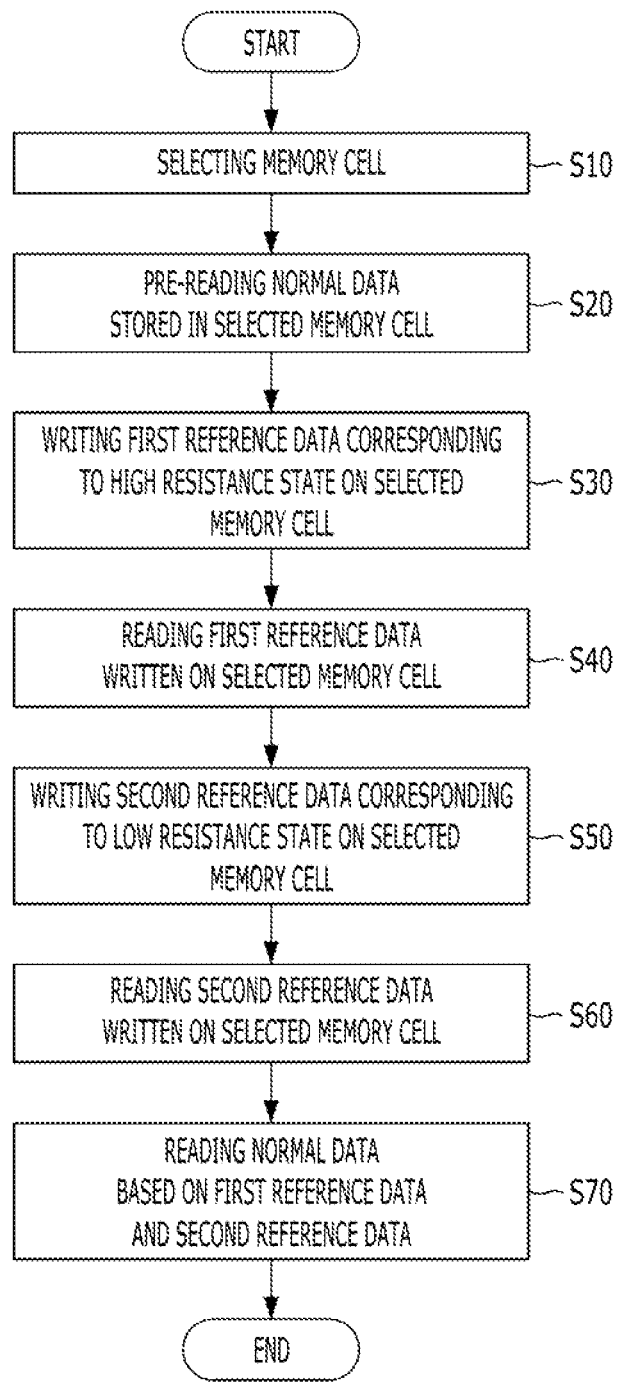
FIG. 4 is a flow chart illustrating a read operation of the resistive memory device in accordance with the embodiment of the present invention.
Figure 5:
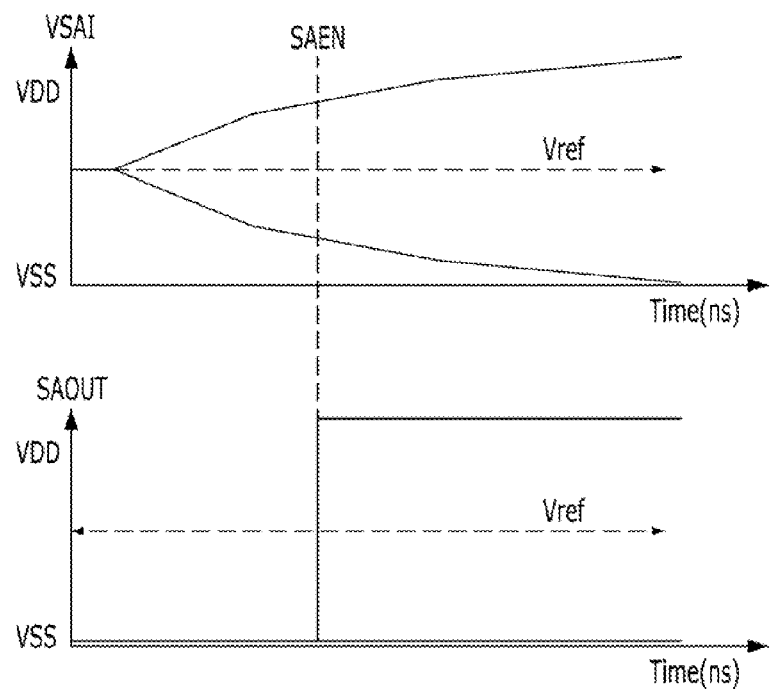
FIG. 5 is a wave form diagram illustrating the sensing and amplifying operation of the resistive memory device in accordance with the embodiment of the present invention.

FIG. 4 is a flow chart illustrating a read operation of the resistive memory device shown in FIG. 3 in accordance with the embodiment of the present invention, FIG. 5 is a wave form diagram illustrating the sensing and amplifying operation of the resistive memory device in accordance with the embodiment of the present invention, and FIG, 6 is a graph illustrating a relation of a reference voltage and a characteristic of the memory cell 210 shown in FIG. 3 in accordance with the embodiment of the present invention.

Referring to FIGS. 3 and 4, at step S10 cell selection step), the memory cell 210 is selected for a read operation. When the memory cell 210 to be read is selected, a normal cell current $I_{CELL}$ is determined based on a normal data, that is, a resistance state of the memory cell 210.

At step S20 (pre-read step), the normal cell current $I_{CELL}$ flowing through the memory cell 210 is mirrored through the mirroring unit 230 and the mirrored current is supplied to the data copy unit 220. As a result, the current cell data, which is converted with the mirrored current, is stored in the data copy unit 220 in a voltage form. More specifically, the first reference current generation unit 237 and the second reference current generation unit 239 generate the first comparison target current $I_{CELL} \times 1/2$ and the second comparison target current $I_{CELL} \times 1/2$ corresponding to the normal cell current $I_{CELL}$ which is mirrored by the second mirroring unit 235, respectively. A sum current of the first comparison target current $I_{CELL} \times 1/2$ and the second comparison target current $I_{CELL} \times 1/2$ becomes the comparison target current $I_{CELL'}$ corresponding to the normal cell current $I_{CELL}$ and is provided to the data copy unit 220. The data copy unit 220 stores the comparison target current $I_{CELL'}$ on the first storage unit 223 through the current mirroring. Meanwhile, at the step S20, the first to third switching units 221, 237_3 and 239_3 are short in response to the activated first to third read enable signal RDEN1, RDEN2 and RDEN3, respectively.

Then, at step S30 (HRS write step), the first reference data corresponding to the high resistance state (HRS) is written on the memory cell 210 by a write circuit (not illustrated). For example, the first reference data corresponding to the high resistance state (HRS) denotes data '0'. As a result, the first cell current $I_{HRS}$ corresponding to the high resistance state (HRS) flows through the memory cell 210.

At step S40 (HRS read step), the first reference current generation unit 237 stores the first reference data, which is written on the memory cell 210, on the second storage unit 237_5 using the current mirroring scheme. That is, the first cell current $I_{HRS}$ is mirrored by the second mirroring unit 235 and is stored in the second storage unit 237_5. Here, the second switching unit 237_3 is short in response to the activated second read enable signal RDEN2 and the first switching unit 225 and the third switching unit 239_3 are opened in response to the deactivated first enable signal RDEN1 and the deactivated third enable signal RDEN3, respectively.

Subsequently, at step S50 (LRS write step), the second reference data corresponding to the low resistance state (LRS) is written on the memory cell 210 by the write circuit (not shown). For example, the second reference data corresponding to the low resistance state (LRS) has a logic high level. Thus, the second cell current $I_{LRS}$ corresponding to the low resistance state (LRS) flows through the memory cell 210.

At step S60 (LRS read step), the second reference current generation unit 239 stores the second reference data, which is written on the memory cell 210, on the third storage unit 239_5 using the current mirroring scheme. That is, the second cell current $I_{LRS}$ is mirrored by the second mirroring unit 235 and is stored in the third storage unit 239_5. Here, the third switching unit 239_3 is short in response to the activated third read enable signal RDEN3. The first switching unit 225 and the second switching unit 237_3 are opened in response to the deactivated first read enable signal RDEN1 and the deactivated second read enable signal RDEN2, respectively.

Then, at step S70 (main read step), the sense amplifying unit 240 senses and amplifies the pre-read normal data based on the first reference data and the second reference data stored in the first reference current generation unit 237 and the second reference current generation unit 239, respectively. More specifically, the first reference current generation unit 237 and the second reference current generation unit 239 generate the first reference current $I_{HRS} \times 1/2$ and the second reference current $I_{LRS} \times 1/2$ based on the first cell current $I_{HRS}$ and the second cell current $I_{LRS}$ stored in the second storage unit 237_5 and the third storage unit 239_5, respectively. Here, the sum current of the first reference current $I_{HRS} \times 1/2$ and the second reference current $I_{LRS} \times 1/2$ becomes a reference current $I_{REF}$ and is provided to the voltage sensing node VSAI. Meanwhile, the comparison target current $I_{CELL'}$ corresponding to the normal cell current $I_{CELL}$ flows through the data copy unit 220. The voltage level of the voltage sensing node VSAI is determined based on the reference current $I_{REF}$ and the comparison target current $I_{CELL'}$. That is, when the amount of the reference current $I_{REF}$ is larger than the amount of comparison target current $I_{CELL'}$, the voltage sensing node VSAI increases toward the power supply voltage VDD. On the contrary, when the amount of the comparison target current $I_{CELL'}$ is larger than the amount of the reference current $I_{REF}$, the voltage sensing node VSAI decreases toward the ground voltage VSS. As a result, the sense amplifying unit 240 senses and amplifies a voltage difference between the reference voltage VREF and a voltage level of the voltage sensing node VSAI in response to a sense enable signal SAEN. Meanwhile, the first switching unit 225 is short in response to the activated first read enable signal RDEN1, and the second switching unit 237_3 and the third switching unit 239_3 are opened in response to the deactivated second read enable signal RDEN2 and the deactivated third read enable signal RDEN3 (refer to FIG. 5).

For reference, the above-described steps S10 to S70 are performed at every read cycle, the first to third read enable signals RDEN1, RDEN2 and RDEN3 may be derived from a read command.

Figure 6:
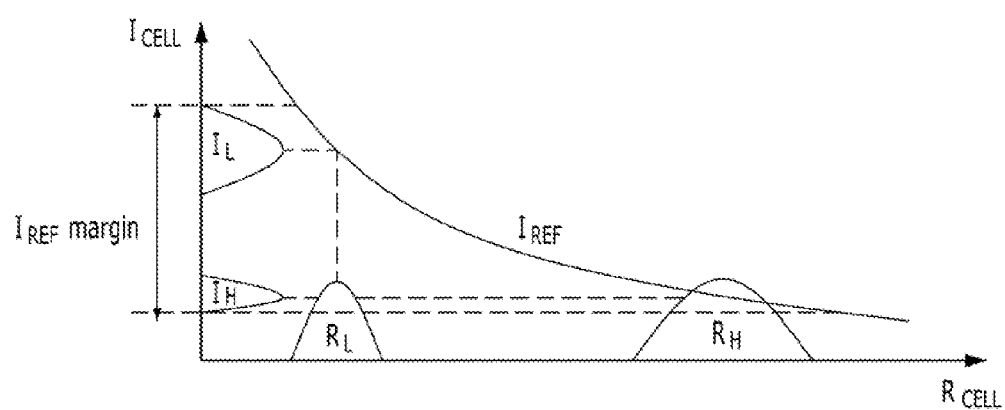
FIG. 6 is a graph illustrating a relation of a reference voltage and a characteristic of a memory cell shown in FIG. 3 in accordance with the embodiment of the present invention.

As shown in FIG. 6, the resistive memory device in accordance with another embodiment of the present application may improve a data sensing capability (namely, a data sensing margin) by generating a reference current $I_{REF}$ having a characteristic corresponding to the cell to be read, and thus the reference current $I_{REF}$ may be optimized to each of the memory cells.

While the present invention has been described with respect to the specific embodiments, it will be apparent to those skilled in the art that various changes and modifications may be made without departing from the spirit and scope of the invention as defined in the following claims.

What is claimed is:

1. A resistive memory device, comprising:
    a plurality of memory cells, each of which is configured to store a normal data, a first reference data corresponding to a first resistance state and a second reference data corresponding to a second resistance state;
    a data copy unit configured to temporarily store the normal data read from a selected memory cell and generate a copied cell current based on the stored normal data;
    a mirroring block configured to temporarily store the first and second reference data read from the selected memory cell, and to generate a first reference current and a second reference current based on the stored first and second reference data, respectively; and
    a sensing unit configured to sense the stored normal data based on the copied cell current and the first reference current and the second reference current.

2. The resistive memory device of claim 1, further comprising:
    a selection unit configured to selectively couple the selected memory cell to the mirroring block in response to a selection signal.

3. The resistive memory device of claim 1, wherein, when the selected memory cell stores the normal data, the data copy unit is configured to store the read normal data by mirroring a cell current flowing through the selected memory cell via the mirroring block.

4. The resistive memory device of claim 1, wherein, when the selected memory cell stores the first reference data, the mirroring block is configured to store the read first reference data by mirroring a cell current flowing through the selected memory cell.

5. The resistive memory device of claim 1, wherein, when the selected memory cell stores the second reference data, the mirroring block is configured to store the read second reference data by mirroring a cell current flowing through the selected memory cell.

6. The resistive memory device of claim 1, wherein the first resistance state is a high resistance state and the second resistance state is a low resistance state.

7. The resistive memory device of claim 1, wherein the mirroring block comprises:
    a first comparison unit configured to compare a voltage level of a cell node with a read voltage;
    a driving unit configured to drive a current through the cell node based on an output signal of the first comparison unit;
    a mirroring unit configured to mirror a cell current flowing through the selected memory cell when the selected memory cell stores the normal data, the first reference data, or the second reference data;
    a first reference current generation unit configured to store the mirrored cell current corresponding to the first reference data, and to generate the first reference current based on the stored value; and
    a second reference current generation unit configured to store the mirrored cell current corresponding to the second reference data, and to generate the second reference current based on the stored value.

8. The resistive memory device of claim 7, wherein the first and the second reference current generation units are configured to simultaneously transfer the mirrored cell current corresponding to the normal data to a sensing node.

9. The resistive memory device of claim 8, wherein the data copy unit includes a capacitor configured to temporarily store the mirrored cell current, corresponding to the normal data, flowing through the sensing node.

10. The resistive memory device of claim 8, wherein the first reference current generation unit includes a capacitor configured to temporarily store the mirrored cell current corresponding to the first reference data.

11. The resistive memory device of claim 8, wherein the second reference current generation unit includes a capacitor configured to temporarily store the mirrored cell current corresponding to the second reference data.

12. The resistive memory device of claim 8, wherein the sensing unit includes a second comparison unit for comparing a voltage level of the sensing node with the reference voltage.

13. A resistive memory device, comprising:
a plurality of memory cells, each of which is configured to store a normal data, a first reference data corresponding to a first resistance state and a second reference data corresponding to a second resistance state;
a mirroring unit configured to mirror a cell current flowing through a selected memory cell when the selected memory cell stores the normal data, the first reference data, or the second reference data;
a first reference current generation unit configured to transfer the mirrored cell current corresponding to the normal data to a sensing node, and to temporarily store the mirrored cell current corresponding to the first reference data, and to output a first reference current to the sensing node based on the stored value;
a second reference current generation unit configured to transfer the mirrored cell current corresponding to the normal data to the sensing node, and to temporarily store the mirrored cell current corresponding to the second reference data, and to output a second reference current to the sensing node based on the stored value;
a data copy unit configured to be coupled to the sensing node, copy the normal data and temporarily store a sum of the cell currents, corresponding to the normal data, transferred to the sensing node from the first and second reference current generation unit; and
a sensing unit configured to sense the normal data stored in the memory cell based on the voltage level of the sensing node as a read data corresponding to the normal data.

14. The resistive memory device of claim 13, wherein each of the first and second reference current generation unit transfers the mirrored cell current with being reduced by a half amount.

15. The resistive memory device of claim 13, wherein the sensing unit includes a comparison unit for comparing a voltage level of the sensing node with a reference voltage.

16. The resistive memory device of claim 13, wherein the first resistance state is a high resistance state and the second resistance state is a low resistance state.

17. A method for driving a resistive memory device, the method comprising:
selecting a memory cell to be read;
pre-reading a normal data stored in the selected memory cell, and storing the read normal data in a temporary storage;
writing a first reference data corresponding to a first resistance state on the selected memory cell;
reading the first reference data and storing the read first reference data in the temporary storage;
writing a second reference data corresponding to a second resistance state on the selected memory cell;
reading the second reference data and storing the read first reference data in the temporary storage; and
reading the normal data, which is stored in the temporary storage, based on the first reference data and the second reference data.

18. The method of claim 17, wherein all of the steps are performed for a read operation on the selected memory cell.

19. The method of claim 17, wherein the temporary storage includes:
a first temporary storage unit configured to store the read normal data;
a second temporary storage unit configured to store the read first reference data; and
a third temporary storage unit configured to store the read second reference data.

20. The method of claim 19, wherein the read normal data, the read first reference data and the read second reference data are stored in the respective temporary storage units by mirroring a cell current flowing through the selected memory cell, respectively.

* * * * *